United States Patent
Cho et al.

(10) Patent No.: US 6,262,574 B1
(45) Date of Patent: Jul. 17, 2001

(54) SENSOR FOR MEASURING MAGNETIC FIELD STRENGTH AND TEMPERATURE FOR AN ELECTRIC MOTOR

(75) Inventors: Chahee P. Cho, Carmel, IN (US); Chong O. Lee, Lancaster, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/285,171

(22) Filed: Mar. 12, 1999

(51) Int. Cl.[7] .................................................... G01R 33/02
(52) U.S. Cl. ................... 324/244.1; 324/96; 250/227.19
(58) Field of Search ................... 324/244.1, 96, 324/252; 250/227.19, 227.11, 227.14, 227.17, 227.18; 359/280, 282; 385/12, 13; 702/134, 135

(56) References Cited

U.S. PATENT DOCUMENTS

| | | | |
|---|---|---|---|
| 4,433,291 | * | 2/1984 | Yariv et al. ........................ 324/244.1 |
| 4,591,786 | * | 5/1986 | Koo et al. .......................... 324/244.1 |
| 4,600,885 | * | 7/1986 | Koo et al. .......................... 324/244.1 |
| 4,622,460 | * | 11/1986 | Failes et al. ..................... 250/227.19 |
| 4,868,495 | * | 9/1989 | Einzig et al. ............................ 324/97 |
| 4,899,042 | * | 2/1990 | Falk et al. ....................... 250/227.19 |
| 4,974,182 | * | 11/1990 | Tank ..................................... 702/135 |
| 5,239,488 | * | 8/1993 | Markham et al. ................... 702/135 |

* cited by examiner

Primary Examiner—Jay Patidar
(74) Attorney, Agent, or Firm—Michael J. McGowan; Prithvi C. Lall; Michael F. Oglo

(57) ABSTRACT

A sensor for facilitating the measurement of temperature and magnetic field is described. The sensor comprises an optical cable having a distal end encompassed in a sheath of giant magnetoresistive material. Temperature changes alter the spectrum emissivity of the giant magnetoresistive material. Magnetic field changes alter the spectrum changes that occur from distorting the optical fiber that occur when the giant magnetoresistive material distorts the optical fiber.

14 Claims, 5 Drawing Sheets

SENSOR FOR MEASURING MAGNETIC FIELD STRENGTH AND TEMPERATURE FOR AN ELECTRIC MOTOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

This invention generally relates to sensors useful in electric control circuits and more particularly to a sensor that can measure temperature and magnetic field strength in an electric motor for facilitating motor control.

(2) Description of the Prior Art

Electric motors operate with diverse operating requirements, such as maximum efficiency, low noise, high torque and minimum physical size. Prior art motor control systems operate electric motors according to one or more of these or other requirements in response to various parameters, such as winding temperature. This particular parameter is important because it impacts the noise emanating from the motor. Moreover, as winding temperature increases winding resistance increases, so for a given voltage the magnetic field for the motor is reduced.

Stator temperature is another important parameter. Measuring stator operating temperature can provide an indication of operating efficiency. The simplest approach for monitoring stator temperature is to include a resistance temperature detector (RTD) or thermocouple (TC) in the windings. Resistance temperature detectors (RTD) and thermocouple sensors (TC) are inexpensive and easy to handle. However, their outputs are subject to electrical noise. Another approach is to use infrared (IR) thermometry. Sensors incorporating this technology provide a signal that has a significantly lower noise component. However, it has also been found that these systems are expensive and difficult to implement in a reliable manner often requiring constant monitoring of the sensor itself.

Another suggested approach for measuring temperature includes measuring temperature through emissivity measurements. U.S. Pat. No. 4,974,182 to Tank, for example, discloses one such method; U.S. Pat. No. 5,239,488 to Markham et al. discloses another implementation of an emissivity measurement. Although these sensors provide temperature measurements, their constructions are not conducive to inclusion in an electric motor, particularly at locations embedded in stator laminations which are optimal measurement locations. Moreover this apparatus provides only a temperature measurement.

Conventional sensors for measuring magnetic fields includes sense coils and Hall effect sensors. Sense coils are extremely reliable, require no external power and are easily understood. However, they are only capable of measuring alternating magnetic fields. They also have a large size and weight and the output signal has significant noise. Hall effect transistors, on the other hand, are comparatively small and lightweight. They are extremely reliable and measure both AC and DC fields. They require external power in the form a reference current in order to produce an output signal.

Some prior art references have proposed measuring both parameters. For example, U.S. Pat. No. 4,899,042 (1990) to Falk et al. discloses an integrated optic field sensor that includes an interferometer formed in a substrate. These integrated optical sensors measure electric, magnetic and temperature fields. The sensors are based upon stress-induced, refractive index changes in a first arm of a bridge. Electric and magnetic field sensors are also disclosed based upon evanescent field coupling between the field sensitive material and a first arm. While this patent discloses a system for measuring different parameters, a separate sensor is required for each parameter. Moreover, the method of sensing is to alter the path length.

Other devices have been proposed for using optical techniques for measuring magnetic fields. These include U.S. Pat. No. 4,433,291 (1984) to Yariv that discloses an optical fiber cable and magnetic field detector magnetostrictively reactive to the presence of an external magnetic field. A magnetostrictively responsive jacket disposed about the periphery of a fiber optic core responds to magnetic fields and strains the core effecting the light transmission through the core. An interferometer detects the changes. U.S. Pat. No. 4,591,786 (1986) to Koo et al. discloses a fiberoptic magnetic radiometer with variable magnetic biasing fields for measuring AC and DC magnetic field gradients. An optical interferometer includes magnetostrictive magnetic field sensing elements in each of the interferometer arms. U.S. Pat. No. 4,600,885 (1986) to Koo et al. discloses another fiberoptic magnetometer for detecting DC magnetic fields in which an AC magnetic field of a known frequency and constant amplitude is imposed such that the DC field introduces a detectable phase shift.

U.S. Pat. No. 4,622,460 (1986) to Failes et al. discloses a fiberoptic magnetic sensor with a thin walled cylindrical barrel having an elastically radially deformable mid-section. A single mode optical fiber is wound about the mid-section of the barrel and a magnetostrictive element is located within the center of the barrel. Field changes affect the length of the magnetostrictive element and consequently cause axial forces to be applied to the end of the barrel deforming the mid-portion and inducing a strain in the optical fiber from which the external magnetic field strength may be deduced.

U.S. Pat. No. 4,868,495 (1989) to Einzig et al. discloses a sensor with a single mode optical fiber for detecting electrical currents or magnetic fields. A current transformer utilizes a fiberoptic sensor and a phase modulated single mode fiberoptic interferometer such that a magnetostrictive element measures magnetic fields. This element comprises a tubular element having a slot along its length to allow the ingress and egress of a conductor, such as an electrical cable.

Each of the foregoing references discloses one of a number of diverse approaches for measuring either magnetic field or temperature. However, none of these references discloses a structure by which a single sensor provides information from which the values of both temperature and magnetic field strength can be deduced. Consequently, measurements of both require a duplication of the number of sensors. Such duplication increases volume and increases cost. Moreover many of the foregoing structures, particularly for measuring magnetic field, are not readily adapted for use in motor control circuits wherein the optimal position location of such sensors is between existing stator laminations in a motor.

SUMMARY OF THE INVENTION

Therefore it is an object of this invention to provide a sensor for generating information from which temperature and magnetic field strength can be deduced.

Another object of this invention is to provide a single sensor from which temperature and magnetic field strength can be deduced and which is compact and easy to use.

Another object of this invention is to provide a single sensor for measuring temperature and magnetic field for providing information from which temperature and magnetic field can be deduced and which is adapted for construction on a silicon chip for producing temperature and magnetic field information signals that have a high signal-to-noise ratio.

In accordance with one aspect of this invention a sensor for measuring magnetic field strength and the temperature at a body includes a giant magnetoresistive sheath for contacting the body and which is thus subjected to the magnetic field and temperature at the body. The giant magnetoresistive sheath overlies an optical means for receiving energy emanating from the giant magnetoresistive structure. A first processor connects to the optical means for generating a temperature signal indicative of the temperature at the body. A second processing means connects to the optical means for generating a magnetic field strength signal indicative of the magnetic field strength of the body.

In accordance with another aspect of this invention an electric motor system comprises an electric motor having stator laminations, a motor control located remotely from the electric motor for controlling the energization of the electric motor in response to input signals and a cable interconnecting the motor control means and the motor. A sensor is located at each of at least one location in the stator laminations. Each sensor comprises giant magnetoresistive means for contacting the proximate stator laminations thereby to be subjected to the magnetic field and temperature of the proximate stator laminations and an optical structure that contacts the giant magnetoresistive sheath for coupling energy emanating from the giant magnetoresistive material. A first processing means connects to the optical means for generating a temperature signal indicative of the temperature at the stator laminations and a second processor generates a magnetic field strength signal indicative of the magnetic field strength at the stator laminations in response to the energy from the optical means.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF THE PREFERRED EMBODIMENT

Figure 1:
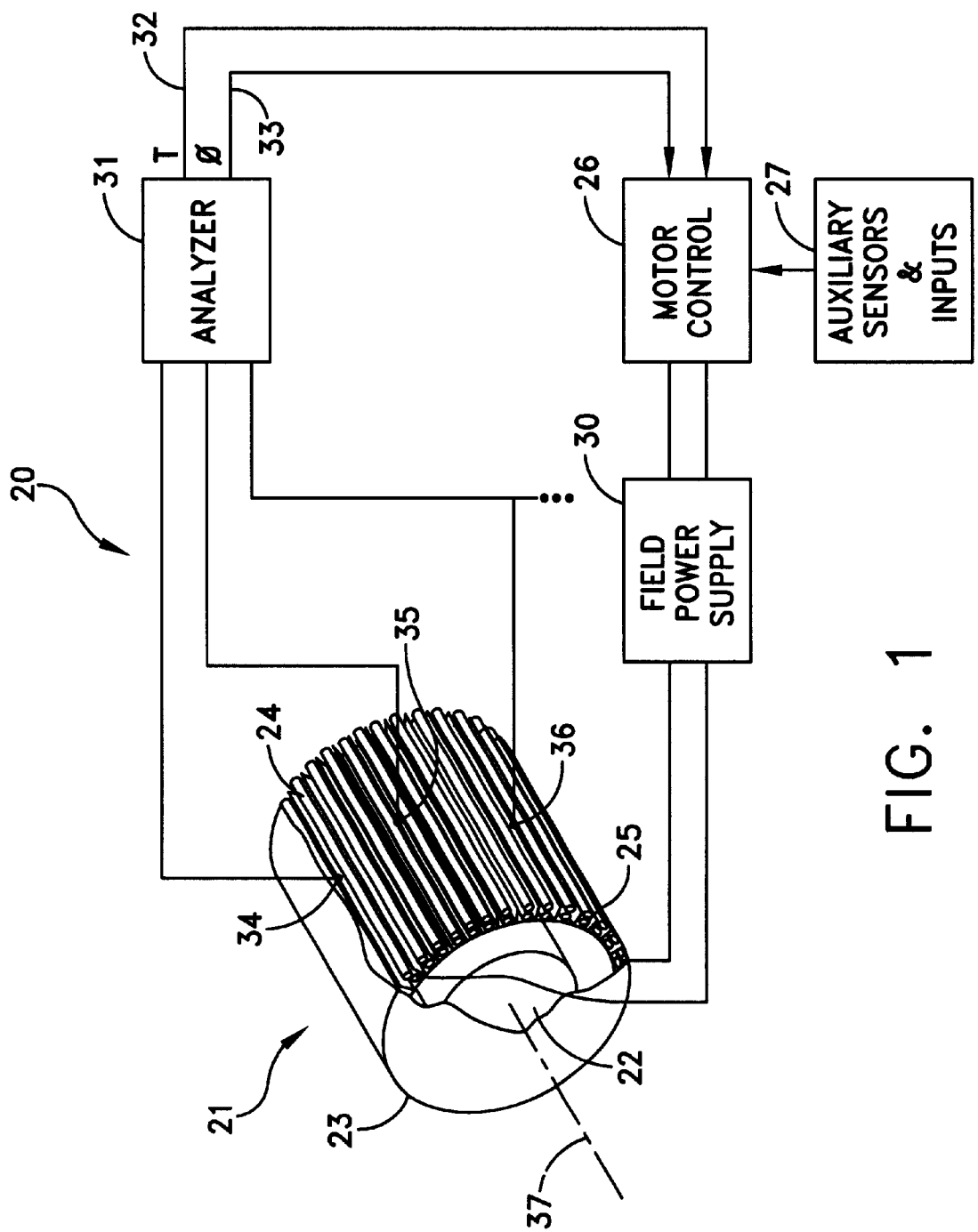
FIG. 1 is a diagram of an electric motor system constructed in accordance with this invention.

FIG. 1 schematically depicts an electric motor system 20 that includes an electric motor 21 with an armature or rotor 22 and a stator 23 The stator 23 comprises a plurality of radial stator laminations 24 that carry a field winding 25.

The electric motor system 20 also includes a motor control 26 that responds to auxiliary sensors and inputs 27 for establishing the energization of the field winding 25 by a field power supply 30. Typically the auxiliary sensors and inputs 27 will receive signals representing motor speed or other operating parameters and operator provided input such as a speed set point. The general configuration of the electric motor system 20 is well known in the art. FIG. 1 represents one specific electric motor system that can benefit from this invention. It will become apparent that other electric motor systems can also benefit from this invention.

In accordance with this invention an analyzer 31, that can be proximate to or remote from the stator 24, generates a temperature (T) signal on a conductive path 32 and a magnetic field ($\phi$) signal on a conductive path 33. The motor control 26 uses these signals, in a conventional way, to further control the field power supply 30 or other comparable motor parameter circuit.

The analyzer 31 in FIG. 1 receives signals from at least one sensor. FIG. 1 depicts three sensors 34, 35 and 36 that, in this embodiment, are located between adjacent laminations and extend radially with respect to a motor axis 37. In accordance with this invention each of the sensors 34, 35 and 36 has the same construction and is capable of providing a signal from which the temperature of the laminations 24 and the magnetic field in the laminations 24 can be determined.

Figure 2:
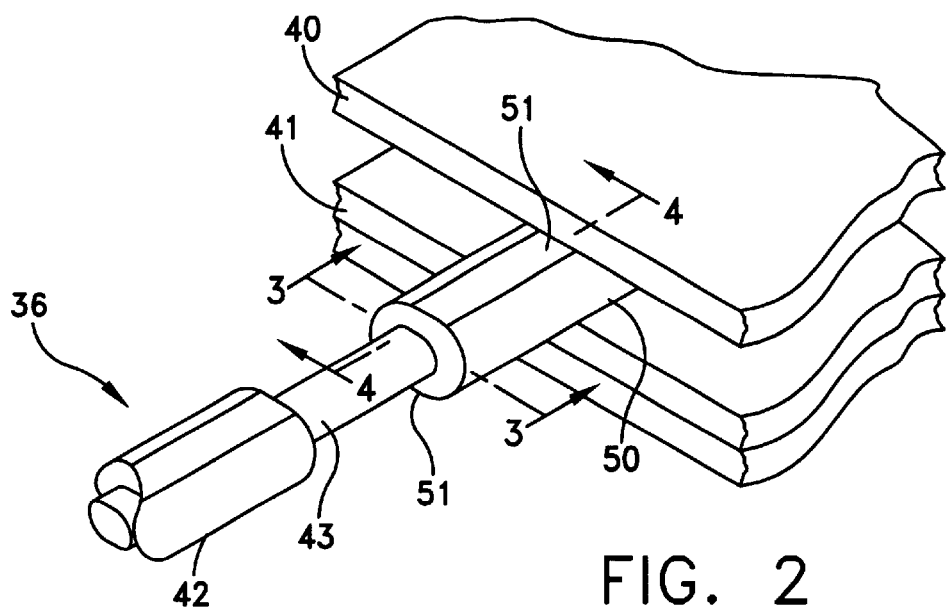
FIG. 2 is a detailed perspective view of a portion of the electric motor shown in FIG. 1 including one sensor location.
Figure 3:
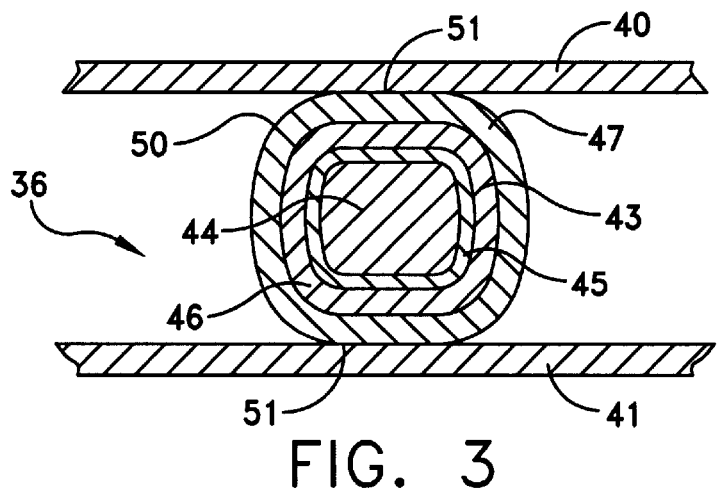
FIG. 3 is a cross-section taken along lines 3—3 in FIG. 2.
Figure 4:
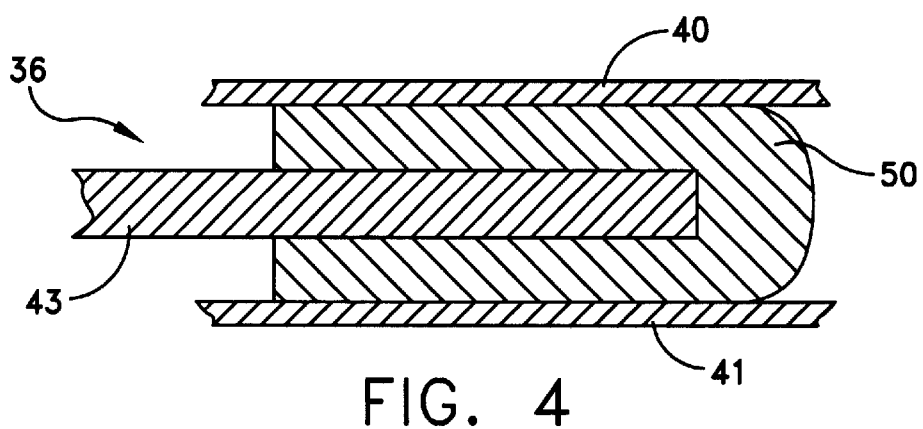
FIG. 4 is a cross-section taken along lines 4—4 in FIG. 2.

FIGS. 2 through 4 depict, as an enlarged detail, one embodiment of such a sensor 36 that is disposed between adjacent laminations 40 and 41. The sensor 36 comprises a sheath 42 that surrounds an optical fiber 43. The optical fiber 43 can comprise a two-glass or three-glass fiber and FIG. 3 particularly depicts a three-glass fiber with a central light transmitting core 44, a concentric reflecting layer 45 and a fusible cladding layer 46 all lying within the sheath 42. An end portion 50 of the optical fiber 47 is concentric with and coextensive with the end portion 50 of the optical fiber 43, and the sheath 42 includes parallel flats 51 for abutting the adjacent stator laminations.

In accordance with this invention the end portion 50 comprises a "giant magnetoresistive" (GMR) material. We have found that temperature changes alter the spectral emissivity of the energy from the GMR material in a predictable fashion and that changes in the magnetic field alter the transmission characteristics of the optical fiber surrounded by the GMR material such that a spectrum of that light changes, also in a predictable manner. Moreover we have found that the effects of temperature and magnetic field changes are independent of each other at least to a first order of magnitude. More specifically, we have found that the following relationship exists between temperature, T, and spectral emissivity of the GMR material:

$$\frac{1}{T} = \frac{1}{T_r} + \frac{\ln(\varepsilon_{\lambda_1}/\varepsilon_{\lambda_2})}{c\left(\frac{1}{\lambda_1}\right)} \qquad 1$$

In this equation $\lambda_1$ and $\lambda_2$ represent two different wavelengths of the energy emanating from said giant magnetoresistive material, $\varepsilon_1$ and $\varepsilon_2$ represent the spectral emissivities at the two different wavelengths, c represents the speed of light and $T_r$ is the ratio temperature of the surface. The ratio temperature ($T_r$) is the temperature of the GMR material as a ratio with respect to a reference temperature. Thus, monitoring and analyzing the spectral emissivity of the energy received in the optical fiber provides information from which conventional spectral emissivity analysis can produce a signal that accurately represents the temperature T.

Magnetic field variations alter the stress that the GMR material in the end portion 50 imposes on the coextensive portions of the optical fiber 43. The forces and the spectrum of the light vary according to:

$$F_{er} = \frac{\varepsilon_0 i^2 l^2}{2r^2\sigma^2 A} - \frac{\varepsilon_0 i l^2}{r^2\sigma A} \qquad 2$$

wherein where $\varepsilon_0$ is the insulation dielectric constant for the giant magnetoresistive material, i is the current in the giant magnetoresistive material, l is the length of the embedded fiber portion, r is the radius of the optical fiber, $\sigma$ is the conductivity of the giant magnetoresistive material and A is the cross section of the interface between the giant magnetoresistive material and the length of the optical fiber subjected to the force $F_{er}$, such as the surface of flats 51.

Specifically, as the magnetic field changes, the current, i, changes and alters the force that the sheath exerts on the optical fiber 43. This alters the stresses over the length of the optical fiber that is coextensive with the sheath 42 and changes the spectrum of the light passing through this portion. As previously indicated, the analysis of such changes in the spectrum of the light is readily determined.

Moreover, in accordance with equations (1) and (2) changes of the spectral emissivity are independent of changes in the magnetic field and that the changes in the spectrum are independent of the changes in temperature at least to the first order. Consequently, changes in temperature do not affect the magnetic field reading. Conversely, changes in the magnetic field do not affect the temperature reading.

Figure 5:
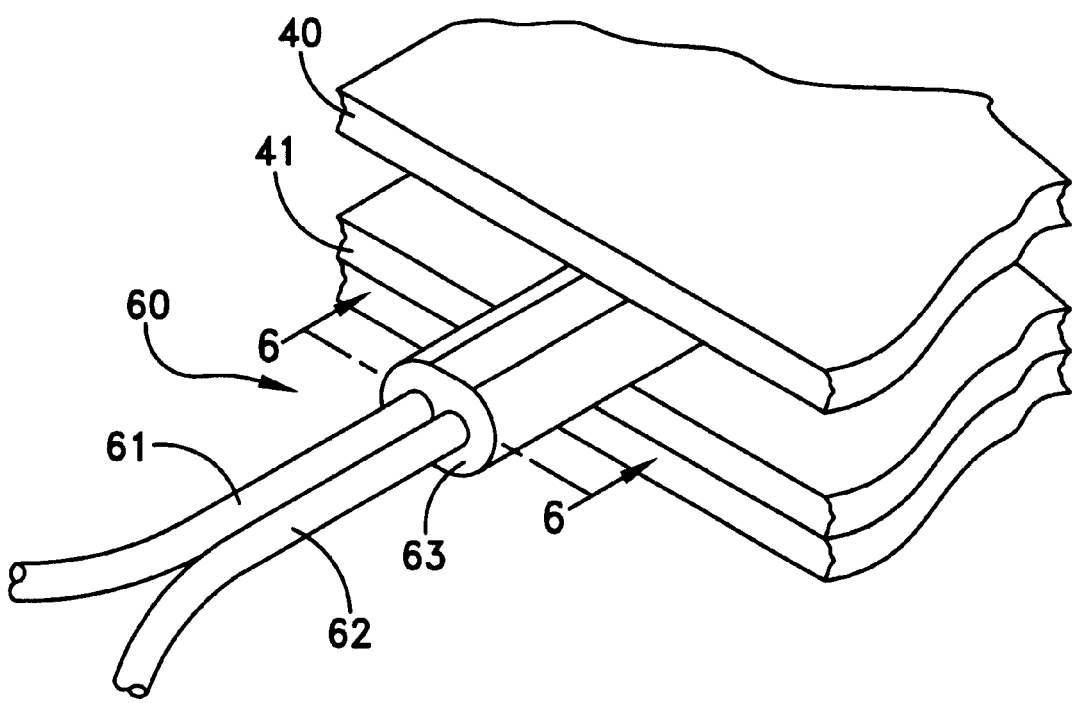
FIG. 5 is a perspective view of an alternate version of a sensor constructed in accordance with the teachings of this invention.
Figure 6:
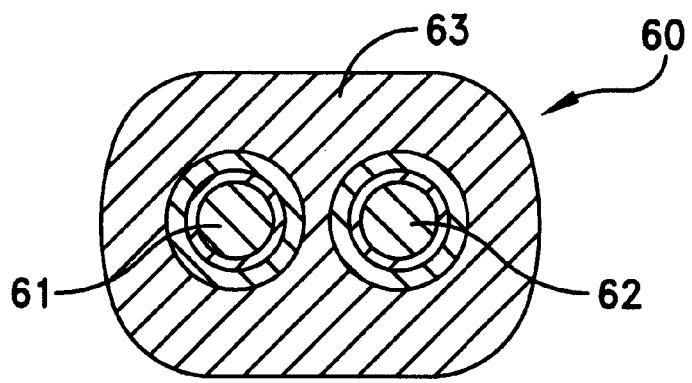
FIG. 6 is a cross-section view taken along lines 6—6 in FIG. 5.

Any of a wide variety of giant magnetorestrictive materials can form the sheath 42. Particularly suited materials include, but are not limited to the alloys:

$Cu_{60}$—$Ni_{20}$—$Fe_{20}$, $Ag_x$—$Ni_y$—$Fe_z$, and $Co_x$—$Ag_y$—$Cu_z$. $\qquad 3$ The embodiment at the distal end of the sensor shown in FIGS. 2 through 4 assumes that the changes in radiant energy inherently produced by the material under differing temperatures, with a sufficient magnitude to enable accurate analysis. If the characteristic emissivity for a particular giant magnetorestrictive material is not sufficient, an alternate sensor 60 can be incorporated as shown in FIGS. 5 and 6. Sensor 60 has the same basic construction as that of sensor 36 in FIGS. 2 through 4 except for the inclusion of a first optical fiber 61 and a second optical fiber 62 in the sheath 63 of GMR material. In this particular application the distal ends of the optical fibers would be remotely spaced from a proximate surface of the GMR material by at least two wavelengths (according to Nyquist criteria) to enable radiant energy such as light in the visible spectrum, to reflect from the GMR material back into the optical fiber 62. As will also be apparent, forces on the optical fiber exerted by the GMR sheath 63 introduce spectrum changes in the coextensive portions of both fibers 61 and 62 so the additional optical fiber length being defined would have to be taken into account. In such a system, however, the standard for the temperature ratio measurement could then be the temperature of the radiant energy supplied through the optical fiber 61.

Figure 7:
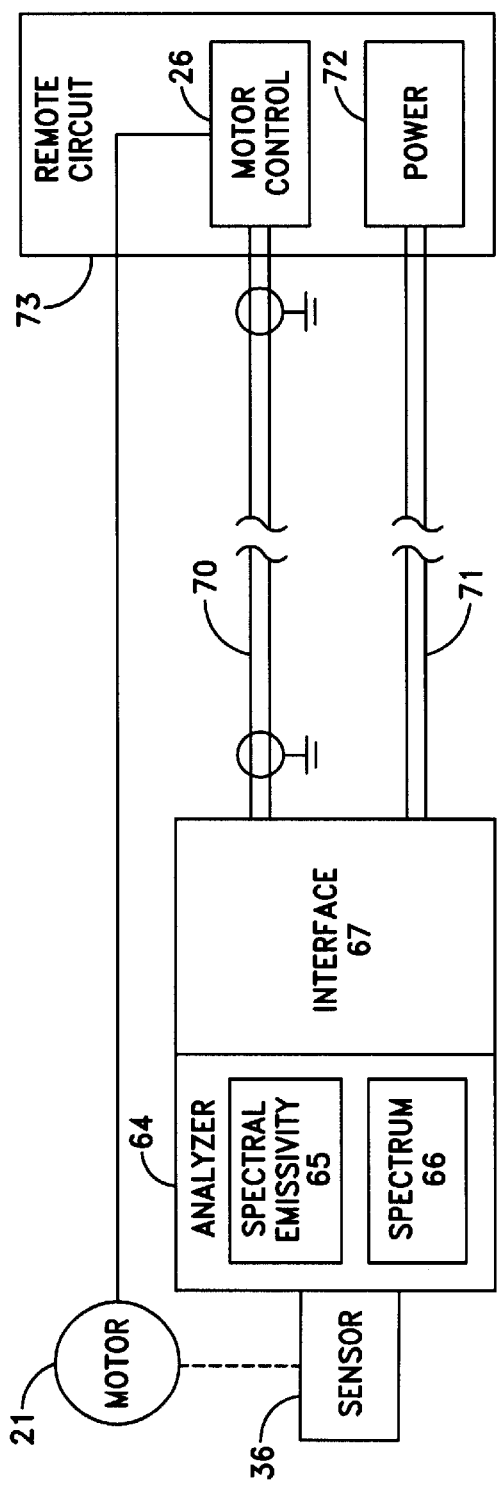
FIG. 7 depicts one embodiment of an electric motor system constructed in accordance with this invention.
Figure 8:
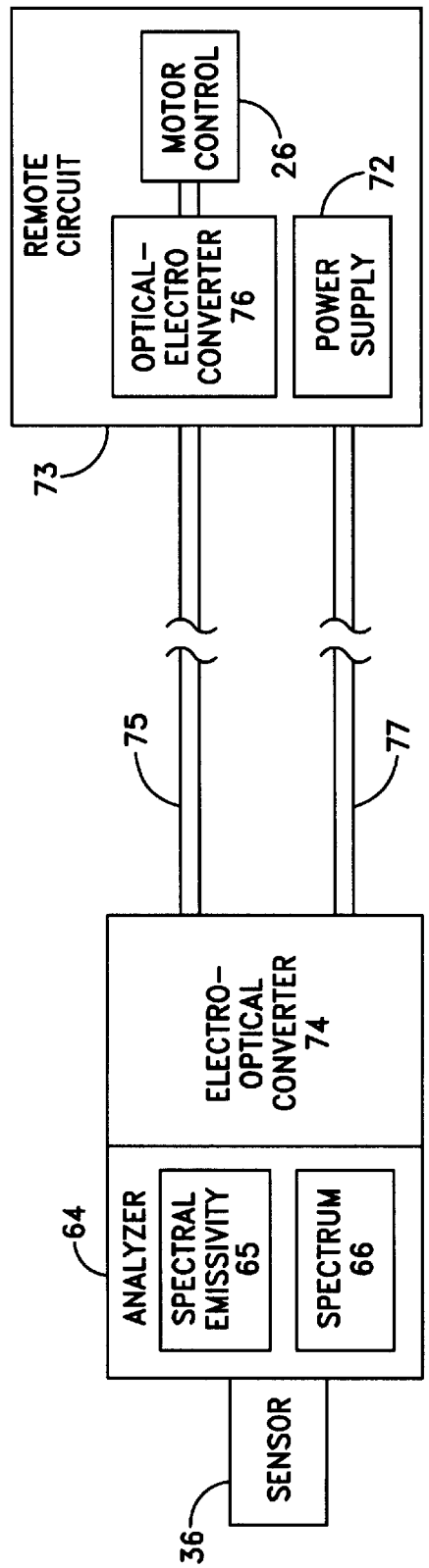
FIG. 8 depicts another embodiment of an electric motor system constructed in accordance with the teachings of this invention.
Figure 9:
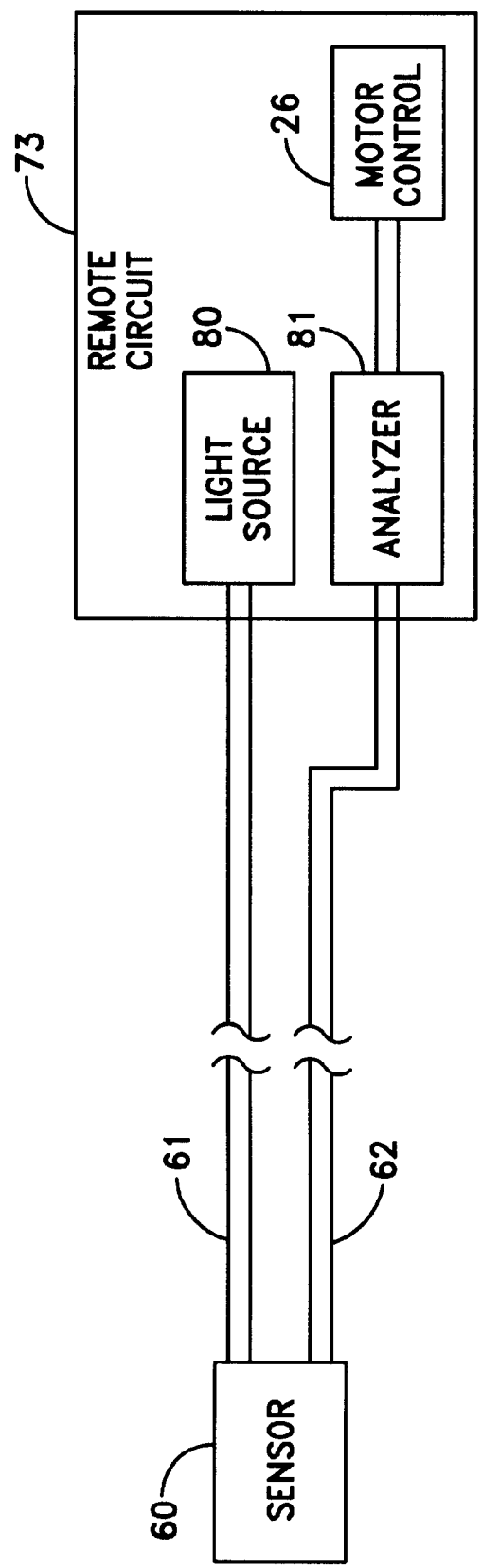
FIG. 9 depicts yet another embodiment of an electric motor system incorporating this invention.

FIGS. 7 through 9 depict different implementations of electric motor systems such as the electric motor system 20 shown in FIG. 1 wherein the motor 21 is physically separated from the motor control 26. Each of the embodiments in FIGS. 7 through 9 depicts a single sensor. It will be apparent that multiple sensors could also be used in these embodiments. As shown in FIG. 1 the analysis would combine the various signals to provide an appropriate temperature and magnetic field profile.

In FIG. 7 the sensors are located at the lamination as shown in FIG. 1 with the sensor 36 having attached and adjacent thereto an analyzer 64 including a spectral emissivity analysis circuit 65 and a spectrum analysis circuit 66. Such analyzers are readily available as silicon chips and can be formed as an integral part of the sensor sheath and optical fiber without increasing the size of the sensor package to any appreciable extent. In this particular embodiment an interface 67 routes signals related to the temperature and magnetic field through a conductive path in the form of a coaxial cable 70, such as a coaxial cable or plurality of coaxial cables. Another conductive path 71 transfers power from a power supply 72 in a remote circuit 73 through the interface 67 to energize the components in the analyzer 64. Thus, in this system a first processing system in the form of a spectral emissivity analyzer 65 is located at the motor adjacent the GMR sheath and provides a signal indicative of temperature while a second processing system in the form of the spectrum analyzer 66 provides a signal indicative of the magnetic field. As will be apparent the conductive paths 70 and 71 can be constituted by coaxial and twisted pair connections combined in a hybrid cable that may also include the conductors for energizing the electric motor 21.

FIG. 8 depicts another embodiment adapted for noisy environments in which the signals are subject to significant electrical noise degradation. In this particular embodiment the analyzer 64 with the spectral emissivity and the spectrum analyzers 65 and 66 connects an electro-optical converter 74 that modulates a light beam for transfer along an optical path 75 to an optical-to-electric converter 76 in the remote circuit 73. A power supply 72 provides power to the analyzer 64 and electro-optical converter 74 through a conductive path 77. Consequently, in this particular version the signals from the analyzers 65 and 66 are converted into optical signals, that can transfer through an optical path 75 in multiple optical channels of modest bandwidth or in a time-division-multiplexed mode to be received by the optical-to-electronic converter 76 thereby to provide temperature and magnetic field signals for the motor controller 26. In this particular embodiment the interconnection between the remote circuit 73 is a hybrid cable including the optical path 75 and electrically conductive path 77.

FIG. 9 depicts a system that could be incorporated using the sensor of FIGS. 5 and 6. That is, the sensor 60 is located at the laminations and only the two fibers 61 and 62 would be carried back to the remote circuit 73. In this particular remote circuit 73 a light source 80 provides the radiant energy through the optical path 61 and an analyzer 81 comprising spectral emissivity and spectrum analyzers would receive the light from the optical path 62 thereby to provide the temperature and magnetic field measurements for the motor control 26.

In summary, a sensor constructed in accordance with this invention includes an optical fiber with a distal end portion located in a sheath of giant magnetoresistive material that is subjected to a magnetic field and temperature to be measured. Temperature changes alter the spectral emissivity of radiant energy emanating from the material. Magnetic field changes the force applied by the GMR material to the optical fiber thereby to change the spectrum of energy passed through the fiber to analysis equipment. The active sensor portion therefore can be constructed extremely reliably and inexpensively. Analysis circuits for monitoring spectral emissivity and light spectrum are readily available and reliably implemented. As particularly evident from FIGS. 7 through 9 the sensor can be used in a wide variety of environments particularly in motor control circuits where the analysis equipment can be located at a motor or at a remote control circuit and the motor and the remote control circuit can be connected with a variety of conventional cables incorporating optical fiber, coaxial cable and other cable for twisted pair and the like cable for carrying power.

As still other approaches could be utilized, for example, a cable having a single optical fiber corresponding to the optical fiber 61 could be used to convey light from a light source to the sensor while an analyzer 64 and interface 67 such as shown in FIG. 7 could be utilized to interpret the light from an optical fiber like the optical fiber 62 for purposes of generating signals representing temperature and magnetic field on a conductive path in the form of a coaxial cable 70.

This invention has been disclosed in terms of certain embodiments. It will be apparent that many modifications can be made to the disclosed apparatus without departing from the invention. Therefore, it is the intent of the appended claims to cover all such variations and modifications as come within the true spirit and scope of this invention.

What is claimed is:

1. A sensor for measuring magnetic field strength and temperature of a body comprising:

giant magnetoresistive means for being subjected to the magnetic field and temperature of the body;

optical means in contact with said giant magnetoresistive means for coupling energy emanating therefrom;

first processing means connected to said optical means for generating a temperature signal indicative of the temperature of the body; and second processing means connected to said optical means for generating a magnetic field strength signal indicative of the magnetic field strength in the body.

2. A sensor as recited in claim 1 wherein said second processing means includes means for measuring the spectrum of the energy received from said optical means.

3. A sensor as recited in claim 2 wherein said optical means includes an optical fiber having a portion thereof embedded in said giant magnetoresistive material and wherein the change in the spectrum of energy received from said optical means changes as a function of a force applied to said optical means according to:

$$F_{er} = \frac{\varepsilon_0 i^2 l^2}{2r^2\sigma^2 A} - \frac{\varepsilon_0 i l^2}{r^2 \sigma A}$$

where $\varepsilon_0$ is the insulation dielectric constant for the giant magnetoresistive material, i is the current in the giant magnetoresistive material, l is the length of the embedded fiber portion, r is the radius of the optical fiber, $\sigma$ is the conductivity of the giant magnetoresistive material and A is the cross section of the interface between the giant magnetoresistive material and the and optical fiber subjected to the force $F_{er}$.

4. A sensor as recited in claim 1 wherein said first processing means includes means for measuring the spectrum emissivity of the energy emanating from said giant magnetoresistive means.

5. A sensor as recited in claim 4 wherein said first processing means establishes the temperature, T, of the body according to:

$$\frac{1}{T} = \frac{1}{T_r} + \frac{\ln(\varepsilon_{\lambda_1}/\varepsilon_{\lambda_2})}{c\left(\frac{1}{\lambda_1}\right)}$$

wherein $\lambda_1$ and $\lambda_2$ represent two different wavelengths of the energy emanating from said giant magnetoresistive material, $\varepsilon\lambda_1$ and $\varepsilon\lambda_2$ represent the spectral emissivities at the two different wavelengths, c represents the speed of light and $T_r$ is the ratio temperature of the surface.

6. A sensor as recited in claim 4 wherein said second processing means includes means for measuring the spectrum of the energy received from said optical means.

7. A sensor as recited in claim 6 wherein said optical means includes an optical fiber having a portion thereof embedded in said giant magnetoresistive material and wherein the change in the spectrum of energy received from said optical means changes as a function of a force applied to said optical means according to:

$$F_{er} = \frac{\varepsilon_0 i^2 l^2}{2r^2\sigma^2 A} - \frac{\varepsilon_0 i l^2}{r^2 \sigma A}$$

where $\varepsilon_0$ is the insulation dielectric constant for the giant magnetoresistive material, i is the current in the giant magnetoresistive material, l is the length of the embedded fiber portion, r is the radius of the optical fiber, $\sigma$ is the conductivity of the giant magnetoresistive material and A is the cross section of the interface between the giant magnetoresistive material and the and optical fiber subjected to the force $F_{er}$.

8. A sensor as recited in claim 6 wherein said first and second processing means are located proximate said giant magnetoresistive material.

9. A sensor as recited in claim 8 adapted for connection to remote circuit means for utilizing the temperature and magnetic field measurements wherein said first and second processing means generate the temperature and magnetic field strength signals in electrical form and wherein said sensor additionally comprises electric signal conductive means for conveying the electrical signals and power signals between said first and second processing means and the remote circuit means.

10. A sensor as recited in claim 8 adapted for connection to remote circuit means for utilizing the temperature and magnetic field measurements wherein said first and second processing means generate the temperature and magnetic field strength signals in electrical form and wherein said sensor additionally comprises first means for converting the electric signals from said first and second processing means into optical forms for conveyance to optical-to-electrical conversion means at the remote circuit means and conductive means for conveying power signals from the remote circuit means to said first and second processing means.

11. A sensor as recited in claim 6 wherein said optical means includes first and second optical fibers having portions thereof embedded in said giant magnetoresistive material, said first optical fiber being connected to a light source for conveying energy to a surface of said giant magnetoresistive material and said second optical fiber conveying the energy that reflects from said giant magnetoresistive material to said first and second processing means.

12. A sensor as recited in claim 11 adapted for connection to a remote circuit means for utilizing the temperature and magnetic field measurements and providing power to said sensor and wherein said first and second processing means are proximate said sensor, said sensor additionally comprising cable means for conveying the temperature and magnetic field strength signals and power to the remote circuit means to said first and second processing means and a fiber for conveying radiant energy from said remote circuit means to said sensor.

13. A sensor as recited in claim 11 adapted for connection to a remote circuit means for utilizing the temperature and electric field measurements, providing power to said sensor and radiant energy for said sensor wherein said first and second processing means generate the temperature and magnetic field strength signals in electrical form and wherein said sensor additionally comprises cable means including optical and conductor means, said optical conductor means converting the electrical signals from said first and second processing means into an optical form for conveyance to optical-to-electrical conversion means at the remote circuit means and said conductive conductor means conveying power signals from the remote circuit means to said first and second processing means and an optical fiber for conveying radiant energy from the remote circuit means to said first optical fiber in said optical means.

14. A sensor as recited in claim 11 adapted for connection to remote circuit means that includes said first and second processing means and the remote sensing means includes means for generating radiant energy, said sensor additionally comprising cable means including first and second optical fibers for conveying light to and from said first and second optical fibers in said optical means.

* * * * *